(12) United States Patent
Morimoto

(10) Patent No.: US 10,882,404 B2
(45) Date of Patent: Jan. 5, 2021

(54) EARTH FAULT DETECTING DEVICE, AND ELECTRICITY STORAGE SYSTEM

(71) Applicant: Panasonic Intellectual Property Management Co., Ltd., Osaka (JP)

(72) Inventor: Naohisa Morimoto, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 55 days.

(21) Appl. No.: 16/326,327

(22) PCT Filed: Oct. 16, 2017

(86) PCT No.: PCT/JP2017/037305
§ 371 (c)(1),
(2) Date: Feb. 18, 2019

(87) PCT Pub. No.: WO2018/074394
PCT Pub. Date: Apr. 26, 2018

(65) Prior Publication Data
US 2019/0219621 A1 Jul. 18, 2019

(30) Foreign Application Priority Data
Oct. 21, 2016 (JP) .................. 2016-207247

(51) Int. Cl.
*B60L 3/00* (2019.01)
*G01R 27/18* (2006.01)
(Continued)

(52) U.S. Cl.
CPC .............. *B60L 3/0069* (2013.01); *B60L 3/00* (2013.01); *G01R 27/18* (2013.01); *G01R 31/50* (2020.01);
(Continued)

(58) Field of Classification Search
CPC .......... G01R 27/18; G01R 31/50; B60L 3/00; B60L 3/0069
(Continued)

(56) References Cited

U.S. PATENT DOCUMENTS

2012/0280697 A1 11/2012 Morimoto
2014/0002096 A1* 1/2014 Mizoguchi ............. G01R 27/18
324/503

(Continued)

FOREIGN PATENT DOCUMENTS

JP 2933490 B 8/1999
JP 2003-274504 9/2003
(Continued)

OTHER PUBLICATIONS

International Search Report of PCT application No. PCT/JP2017/037305 dated Jan. 16, 2018.

*Primary Examiner* — Christopher E Mahoney
(74) *Attorney, Agent, or Firm* — McDermott Will and Emery LLP

(57) ABSTRACT

A capacitor is connected between an output terminal of an impedance element and an electricity storage unit mounted in a vehicle, and the electricity storage unit is electrically insulated from a chassis of the vehicle. An earth fault determiner determines that an earth fault occurs, when a detection value based on a peak-to-peak value of a voltage at a node between the impedance element and the capacitor is less than or equal to a first reference value and more than or equal to a second reference value. The first reference value is set based on the peak-to-peak value of the voltage at the node when an insulation resistance between the electricity storage unit and the chassis of the vehicle is a minimum allowable value. The second reference value is set based on the peak-to-peak value of the voltage at the node (Continued)

when a complete earth fault occurs between the electricity storage unit and the chassis of the vehicle.

4 Claims, 7 Drawing Sheets

(51) Int. Cl.
*G01R 31/50* (2020.01)
*G01R 31/40* (2020.01)
*G01R 31/00* (2006.01)
*G01R 31/36* (2020.01)

(52) U.S. Cl.
CPC ............ *G01R 31/007* (2013.01); *G01R 31/36* (2013.01); *G01R 31/40* (2013.01)

(58) Field of Classification Search
USPC ........................................................ 624/509
See application file for complete search history.

(56) References Cited

U.S. PATENT DOCUMENTS

2017/0197508 A1 7/2017 Kobayashi
2020/0116775 A1* 4/2020 Wakimoto ............. G01R 31/42

FOREIGN PATENT DOCUMENTS

| JP | 2004-104923 | 4/2004 |
| JP | 2007-108074 | 4/2007 |
| JP | 4917192 B | 4/2012 |
| JP | 2015-226343 | 12/2015 |

\* cited by examiner

EARTH FAULT DETECTING DEVICE, AND ELECTRICITY STORAGE SYSTEM

CROSS-REFERENCE TO RELATED APPLICATIONS

This application is a U.S. national stage application of the PCT International Application No. PCT/JP2017/037305 filed on Oct. 16, 2017, which claims the benefit of foreign priority of Japanese patent application No. 2016-207247 filed on Oct. 21, 2016, the contents all of which are incorporated herein by reference.

TECHNICAL FIELD

The present invention relates to an earth fault detecting device that detects an earth fault in an electricity storage unit mounted in a vehicle, and an electricity storage system.

BACKGROUND ART

The spread of hybrid, electric, and fuel cell vehicles has been enhanced in recent years. Such vehicles are equipped with an auxiliary battery and a drive battery (traction battery). In a drive battery, secondary cells, such as lithium ion cells or nickel hydride cells, are interconnected in series to provide a high output voltage. In many cases, drive batteries in a range from 100 V to 400 V are used.

When a drive battery is mounted in a vehicle, it needs to be electrically insulated from the chassis in order to prevent an electric shock and ignition. For example, when a passenger, a repair person, a rescue worker, or some other person touches an exposed conducting part of a vehicle to which the drive battery leaks electric current, he/she may be electrically shocked.

A vehicle equipped with a drive battery typically employs a mechanism for monitoring electrical insulation between the drive battery and the chassis. Major examples of the system for monitoring an electrical insulation include: an electrical non-insulation system that detects an imbalance of an electric current flowing from a positive or negative electrode line to chassis; a clamping system applied to many commercial power supply systems; and an electrical insulation system that cuts off a direct current (DC) by using a coupling capacitor. Currently, the electrical insulation system using a coupling capacitor is mainly used (for example, see PTL 1).

CITATION LIST

Patent Literature

PTL 1: Unexamined Japanese Patent Publication No. 2003-274504

SUMMARY OF THE INVENTION

Technical Problem

In the electrical insulation system using a coupling capacitor, noise generated in a vehicle may flow into a detection circuit via the coupling capacitor. Thus, the detection circuit needs to have low responsivity. To lower the responsivity, it is necessary to increase a capacitance of the coupling capacitor or to connect a low-pass filter to an upstream stage of the detection circuit.

When an electric potential at a vehicle-side terminal of the coupling capacitor fluctuates, an electric potential at a detection-side terminal of the coupling capacitor may fall outside an input voltage range of the detection circuit. If the electric potential at the vehicle-side terminal greatly fluctuates, it may take a long time for the electric potential at the detection-side terminal of the coupling capacitor to return to within the input voltage range of the detection circuit. This is because the responsivity of the detection circuit is lowered. Thus, a considerable time is needed between when an earth fault occurs and when the occurrence of the earth fault is definitively verified. Basically, the determination of presence/absence of an earth fault is based on the amplitude of a voltage at a detection point. However, it is difficult to precisely determine presence/absence of an earth fault when the voltage at the detection point falls outside the input voltage range of the detection circuit.

The present invention has been made in light of the above situations. An object of the present invention is to provide a technique for precisely and briefly determining presence/absence of an earth fault.

An earth fault detecting device according to an aspect of the present invention, which achieves the above object, includes: an impedance element to which a predetermined alternating-current (AC) voltage is applied; a capacitor connected between an output terminal of the impedance element and an electricity storage unit mounted in a vehicle, the electricity storage unit being electrically insulated from a chassis of the vehicle; and an earth fault determiner that determines whether an earth fault is present in the electricity storage unit, based on a detection value, the detection value being based on a peak-to-peak value of a voltage at a node between the impedance element and the capacitor. This earth fault determiner determines that the earth fault occurs, when the detection value is less than or equal to a first reference value and more than or equal to a second reference value, the first reference value being set based on the peak-to-peak value of the voltage at the node when an insulation resistance between the electricity storage unit and the chassis of the vehicle is a minimum allowable value, the second reference value being set based on the peak-to-peak value of the voltage at the node when a complete earth fault occurs between the electricity storage unit and the chassis of the vehicle.

Any desired combinations of the above-described components and converted expressions of the present invention in methods, devices, systems, and other similar entities are still effective as aspects of the present invention.

Advantageous Effect of Invention

According to the present invention, it is possible to precisely and briefly determine presence/absence of an earth fault.

DESCRIPTION OF EMBODIMENT

Figure 1:
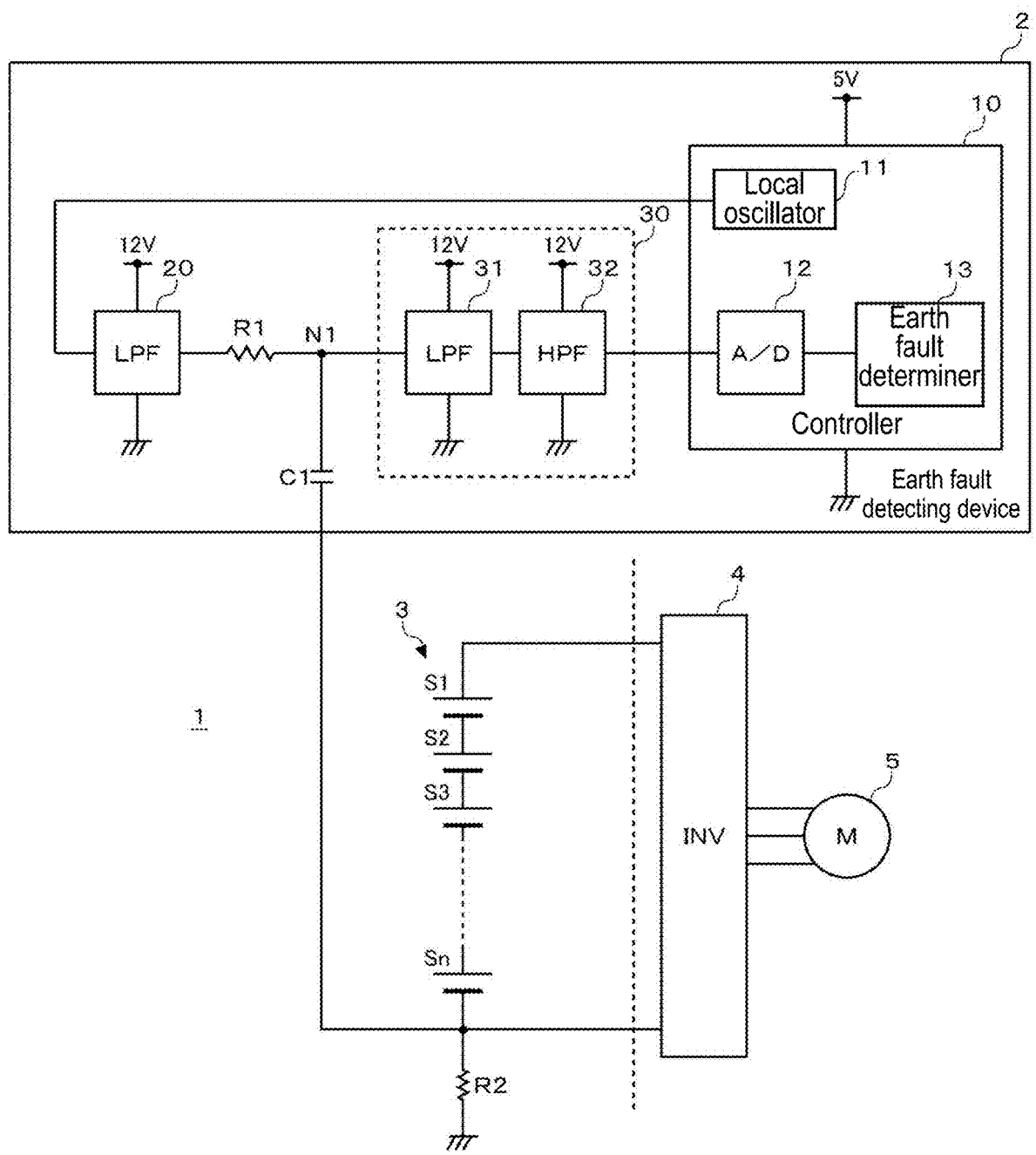
FIG. 1 illustrates an electricity storage system according to an exemplary embodiment of the present invention.

FIG. 1 illustrates electricity storage system 1 according to an exemplary embodiment of the present invention. Electricity storage system 1 is a power supply system for vehicles. Electricity storage system 1 is mounted in a hybrid, electric, fuel cell, or other vehicle equipped with a running motor. Electricity storage system 1 is provided in a vehicle, separately from a 12 V secondary battery for an auxiliary machine (generally, a lead battery is used). Electricity storage system 1 includes electricity storage unit 3, a management device (not illustrated), and earth fault detecting device 2.

Electricity storage unit 3 includes a plurality of cells S1 to Sn interconnected in series. Each of cells S1 to Sn may be a lithium ion battery cell, a nickel hydride battery cell, an electric double layer capacitor cell, or a lithium ion capacitor cell, for example. Instead of being interconnected in series, cells S1 to Sn may be interconnected in parallel to increase their capacitance.

The management device (not illustrated) monitors a voltage, an electric current, or a temperature of the plurality of cells S1 to Sn in electricity storage unit 3. If an overvoltage, undervoltage, overcurrent, temperature abnormality, or other abnormality occurs, the management device turns off a shutdown switch (not illustrated) to protect electricity storage unit 3. For example, the management device controls state-of-charge (SOC), state-of-health (SOH), and equalization of the plurality of cells S1 to Sn.

Inverter 4 is a bidirectional inverter that is connected between electricity storage unit 3 and motor 5. At the time of power running, inverter 4 converts direct-current (DC) power supplied from electricity storage unit 3 into alternating-current (AC) power and supplies the AC power to motor 5. At the time of regeneration, inverter 4 converts AC power supplied from motor 5 into DC power and supplies the DC power to electricity storage unit 3. For example, motor 5 may be a three-phase AC synchronous motor. In a power running mode, motor 5 rotates based on electric power supplied from inverter 4, thereby driving the vehicle. In a regeneration mode, motor 5 generates electric power by rotating based on deceleration energy of the vehicle, and charges electricity storage unit 3 through inverter 4 with the electric power.

In general, a 12 V auxiliary battery (not illustrated) is installed in the vehicle with its negative electrode connected directly to a chassis of the vehicle. Moreover, a high-voltage traction battery is installed while being electrically insulated from the chassis. If a person touches an exposed conducting part in the vehicle when electricity is conducted between the high-voltage traction battery and the chassis, he/she may be electrically shocked. For this reason, a vehicle equipped with a high-voltage traction battery needs to have earth fault detecting device 2 to continuously monitor electrical insulation between the traction battery and a chassis.

Earth fault detecting device 2 includes controller 10, first low-pass filter 20, voltage dividing resistor R1, coupling capacitor C1, and filter 30. Controller 10, which may be implemented by a microcontroller, includes local oscillator 11, AD converter 12, and earth fault determiner 13. Filter 30 includes second low-pass filter 31 and high-pass filter 32. In this exemplary embodiment, each of first low-pass filter 20, second low-pass filter 31, and high-pass filter 32 is assumed to include an active filter.

Earth fault detecting device 2 is supplied with power supply from the 12 V auxiliary battery. The voltage of 12 V is applied to power source terminals of first low-pass filter 20, second low-pass filter 31, and high-pass filter 32 through a power feeding line of the auxiliary battery. The voltage of 12 V is stepped down by a switching regulator (not illustrated) to a voltage of 5 V, which then is applied to the power source terminal of controller 10. Ground terminals of first low-pass filter 20, second low-pass filter 31, high-pass filter 32, and controller 10 are connected to the chassis.

Local oscillator 11 generates and outputs a rectangular wave with a predetermined frequency. First low-pass filter 20 reshapes the rectangular wave received from local oscillator 11 to generate a sinusoidal wave. In this case, first low-pass filter 20 needs to set peak-to-peak value Vp-p of the voltage amplitude to be lower than the power supply voltage (5 V) for controller 10. This exemplary embodiment gives an example in which the rectangular wave is reshaped to the sinusoidal wave whose voltage amplitude has peak-to-peak value Vp-p of 4 V and whose frequency is 2.5 Hz.

An input terminal of voltage dividing resistor R1 is connected to an output terminal of first low-pass filter 20, whereas an output terminal of voltage dividing resistor R1 is connected to a terminal of coupling capacitor C1. The other terminal of coupling capacitor C1 is connected to a negative electrode terminal of electricity storage unit 3. In this case, high electrical leakage resistance R2 is assumed to be virtually connected between the negative electrode terminal of electricity storage unit 3 and the chassis. In this case, the other terminal of coupling capacitor C1 does not necessarily have to be connected to the negative electrode terminal of electricity storage unit 3. Alternatively, this terminal may be connected to any given point of electricity storage unit 3.

Coupling capacitor C1 cuts off a DC component between earth fault detecting device 2 and electricity storage unit 3. This exemplary embodiment gives an example in which a capacitor of 2.5 μF is used. Voltage dividing resistor R1, coupling capacitor C1, and electrical leakage resistance R2 constitute a voltage dividing circuit.

Both local oscillator 11 and first low-pass filter 20 generate an AC voltage, which is applied to the input terminal of voltage dividing resistor R1. Node N1 (referred to below as detection point N1) between voltage dividing resistor R1 and coupling capacitor C1 is connected to an input terminal of second low-pass filter 31. An output terminal of second low-pass filter 31 is connected to an input terminal of high-pass filter 32. An output terminal of high-pass filter 32 is connected to an input terminal of AD converter 12.

Second low-pass filter 31 removes high-frequency components from a voltage at node N1. High-pass filter 32 adjusts an offset of an output voltage from second low-pass filter 31 so that the output voltage falls within an input voltage range of AD converter 12. Since the input voltage range of AD converter 12 is from 0 V to 5 V in this exemplary embodiment, high-pass filter 32 performs a level shift such that the center value (offset value) of the output voltage from second low-pass filter 31 becomes 2.5 V.

AD converter 12 converts an analog voltage received from filter 30 into a digital value and outputs the digital value to earth fault determiner 13. Earth fault determiner 13 determines presence/absence of an earth fault between electricity storage unit 3 and the chassis, based on the received digital value. When an earth fault occurs, earth fault determiner 13 outputs an alert signal that indicates the occurrence of the earth fault to an electronic control unit (ECU) in the vehicle via an in-vehicle network, such as a controller area network (CAN).

When electricity storage unit 3 is ideally electrically insulated from the chassis, the intermediate voltage of electricity storage unit 3 is maintained at or near a voltage of the chassis ground. For example, if the voltage across electricity storage unit 3 is 400 V, the voltage at the positive electrode of electricity storage unit 3 is maintained at or near +200 V, and the voltage at the negative electrode is maintained at or near −200 V.

Consider a situation in which the electrical insulation between electricity storage unit 3 and the chassis is broken, and electrical leakage resistance R2 is thereby decreased to 100 kΩ. In this state, if a person touches an exposed conducting part of a vehicle body, an electric current of about 4 mA may flow through his/her body. In general, it is said that the minimum electric current that can be sensed by a human body is 1 mA, and the maximum allowable electric current that does not physiologically affect the human body is 5 mA. This description gives an example in which the maximum allowable electric current is set to 4 mA in consideration of a margin of 1 mA. In this example, the minimum allowable value of electrical leakage resistance R2 is set to 100 kΩ. Thus, if electrical leakage resistance R2 decreases to less than 100 kΩ, earth fault determiner 13 determines that an earth fault occurs. In other words, an electric leakage may be ignored in an earth fault detection unless electrical leakage resistance R2 decreases to less than 100 kΩ.

Earth fault determiner 13 retains a first reference value in advance; the first reference value is set to a peak-to-peak value (2.2 V in this exemplary embodiment) of a voltage at a detection point when electrical leakage resistance R2 is the minimum allowable value (100 kΩ in this exemplary embodiment). In a basic determination process, earth fault determiner 13 determines that an earth fault occurs, when a voltage actually measured at the detection point has peak-to-peak value Vp-p less than or equal to the first reference value. When the peak-to-peak value exceeds the first reference value, earth fault determiner 13 determines that no earth fault occurs. In the above voltage dividing circuit, the voltage amplitude at detection point N1 decreases as electrical leakage resistance R2 decreases. Thus, earth fault determiner 13 can determine presence/absence of an earth fault by monitoring the voltage at detection point N1.

If the voltage across electricity storage unit 3 is 400 V and electricity storage unit 3 ideally electrically floats from the chassis as in the above example, coupling capacitor C1 accumulates electric charges in accordance with the voltage difference between the voltage at detection point N1 and the voltage (−200 V) at the negative electrode of electricity storage unit 3. When electricity is conducted between the positive electrode of electricity storage unit 3 and the chassis, the voltage at the positive electrode of electricity storage unit 3 transits to 0 V, and the voltage at the negative electrode transits to −400 V. When electricity is conducted between the negative electrode of electricity storage unit 3 and the chassis, the voltage at the positive electrode of electricity storage unit 3 transits to +400 V, and the voltage at the negative electrode transits to 0 V.

When electricity is conducted between the positive electrode of electricity storage unit 3 and the chassis, the voltage at the vehicle-side terminal of coupling capacitor C1 rapidly drops from −200 V to −400 V. In response, the voltage at detection point N1, which is the voltage at the detection-side terminal of coupling capacitor C1, is shifted to about −200 V. As a result, the voltage at detection point N1 falls outside the input voltage range (from 0 V to 12 V in this exemplary embodiment) of second low-pass filter 31. In this state, the offset voltage (2.5 V in this exemplary embodiment) added by high-pass filter 32 is directly applied to AD converter 12 as a constant voltage. In this case, peak-to-peak value Vp-p of the voltage at the detection point becomes about 0 V. Therefore, earth fault determiner 13 may determine that an earth fault occurs.

In the above determination process, the earth fault is determined to occur due to the shift of the voltage at detection point N1 to about −200 V. Therefore, the determination process fails to accurately reflect the result of determining whether electrical leakage resistance R2 is actually decreased to less than 100 kΩ.

When the voltage at the vehicle-side terminal of coupling capacitor C1 rapidly drops from −200 V to −400 V, coupling capacitor C1 is charged. After the charging is completed, the voltage at the detection-side terminal of coupling capacitor C1 returns to about 2.5 V. Thus, if peak-to-peak value Vp-p of the voltage at the detection point continues to be less than or equal to the first reference value even after the charging of coupling capacitor C1 is completed, it is possible to definitively verify that the value of electrical leakage resistance R2 decreases to less than 100 kΩ. In this exemplary embodiment, the time for definitively verifying an earth fault may be set to 10 seconds. This time is a time set based on the maximum time required for the voltage at the detection-side terminal of coupling capacitor C1 to return to a normal value in response to a rapid variation in the voltage at the vehicle-side terminal of coupling capacitor C1.

To shorten a time of charging coupling capacitor C1, it is necessary to decrease the capacitance of charging coupling capacitor C1. However, if the capacitance of charging coupling capacitor C1 is decreased, the detection side may be sensitive to a variation in an electric potential of electricity storage unit 3. An internal resistance of electricity storage unit 3 depends on an electric current flowing through electricity storage unit 3. In a traction battery application, the electric current may frequently vary depending on a vehicle speed, a road surface, or other conditions. Therefore, the electric potential at the negative electrode of electricity storage unit 3 might always fluctuate during the running. To prevent this potential fluctuation from causing earth fault determiner 13 to make an erroneous determination, the capacitance of coupling capacitor C1 is increased, and second low-pass filter 31 is added. In this way, a signal-to-noise (S/N) ratio of the voltage at the detection point is improved. As a result, a long time is required to definitively verify that an earth fault occurs.

Hereinafter, a method of shortening a time for definitively verifying that an earth fault occurs is considered. Earth fault determiner 13 further retains a second reference value; the second reference value is set to a peak-to-peak value (1.1 V in this exemplary embodiment) of the voltage at the detection point when a complete earth fault occurs between electricity storage unit 3 and the chassis of the vehicle (when electrical leakage resistance R2 becomes 0Ω). When a voltage actually measured at the detection point has peak-to-peak value Vp-p less than or equal to the first reference value and more than or equal to the second reference value, earth fault determiner 13 determines that an earth fault occurs. When this condition is not satisfied, earth fault determiner 13 determines that no earth fault occurs.

The minimum value of peak-to-peak value Vp-p of the voltage at the detection point is typically equal to the second reference value. If peak-to-peak value Vp-p of the voltage at the detection point is less than the second reference value, it can be estimated that an abnormality occurs in the detection system. If the voltage at the detection point falls outside the input voltage range of second low-pass filter 31 as in the above case, peak-to-peak value Vp-p of the voltage at the detection point is less than the second reference value. As a result, an earth fault is not determined to occur. In other words, when peak-to-peak value Vp-p of the voltage at the detection point reaches the second reference value, an earth fault can be determined to occur.

The center value of the AC voltage to be applied to AD converter 12 fluctuates in a transient state after an earth fault occurs and then converges to a predetermined value. In this case, if both the voltage dividing circuit and filter 30 normally operate, the average value of the AC voltage to be applied to AD converter 12 is substantially constant and nearly equal to the center value of the AC voltage. Thus, earth fault determiner 13 calculates average value V1 of interval integrated values, over a unit period, of the AC voltage at detection point N1, average value V1 of the maximum and minimum values of the AC voltage over the unit period, or moving average value V1 of the AC voltage over a predetermined period. If calculated average value V1 is nearly equal to the center value of the AC voltage to be applied to AD converter 12, earth fault determiner 13 can estimate that all of the voltage dividing circuit, filter 30, and AD converter 12 normally operate. Thus, when average value V1 becomes a predetermined, substantially constant value that is nearly equal to the center value of the range of the AC voltage to be applied to AD converter 12, earth fault determiner 13 can determine that an earth fault occurs. In short, peak-to-peak value Vp-p of the voltage at the detection point becomes more than or equal to the second reference value, and average value V1 falls within a range nearly equal to the center value of the AC voltage to be applied to AD converter 12, which triggers earth fault determiner 13 to detect that peak-to-peak value Vp-p of the voltage at the detection point is less than or equal to the first reference value. In this way, earth fault determiner 13 can promptly determine that an earth fault occurs without making an erroneous determination.

Figure 2:
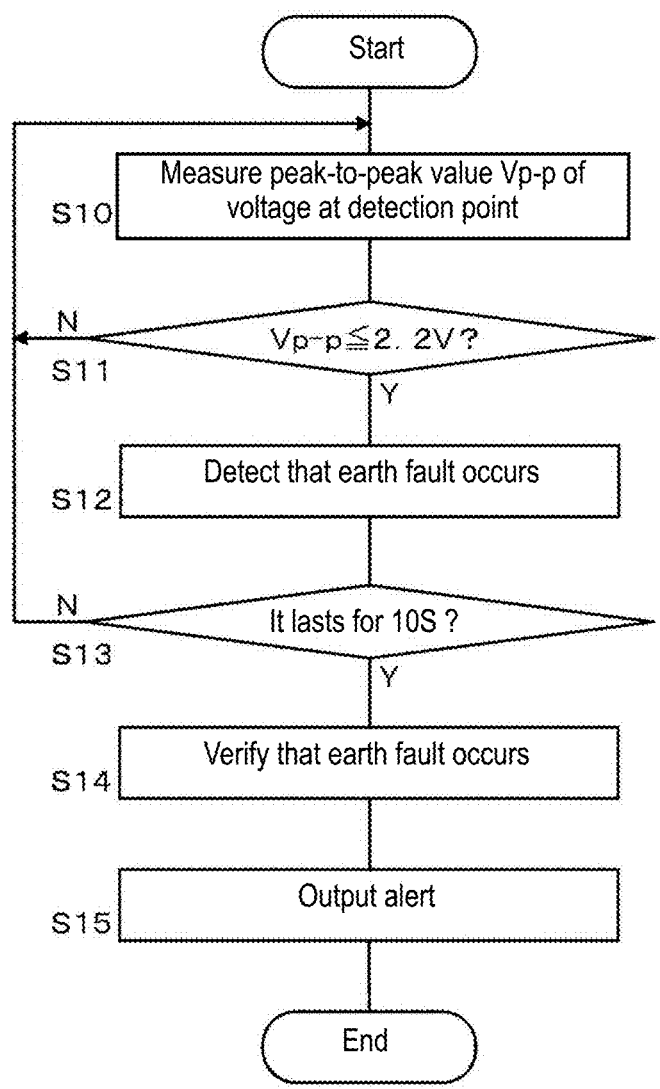
FIG. 2 is a flowchart of an earth fault determination method according to a comparative example.

FIG. 2 is a flowchart of an earth fault determination method according to a comparative example. Earth fault determiner 13 measures peak-to-peak value Vp-p of the voltage at the detection point (S10). Earth fault determiner 13 compares measured peak-to-peak value Vp-p with the first reference value (2.2 V) (S11). When measured peak-to-peak value Vp-p is less than or equal to the first reference value (2.2 V) (Y at S11), earth fault determiner 13 detects that an earth fault occurs (S12). When this state lasts for a preset time (10 seconds in the comparative example) (Y at S13), earth fault determiner 13 definitively verifies that the earth fault occurs (S14). After definitively verifying the occurrence of the earth fault, earth fault determiner 13 outputs an alert to the ECU (S15).

Figure 3:
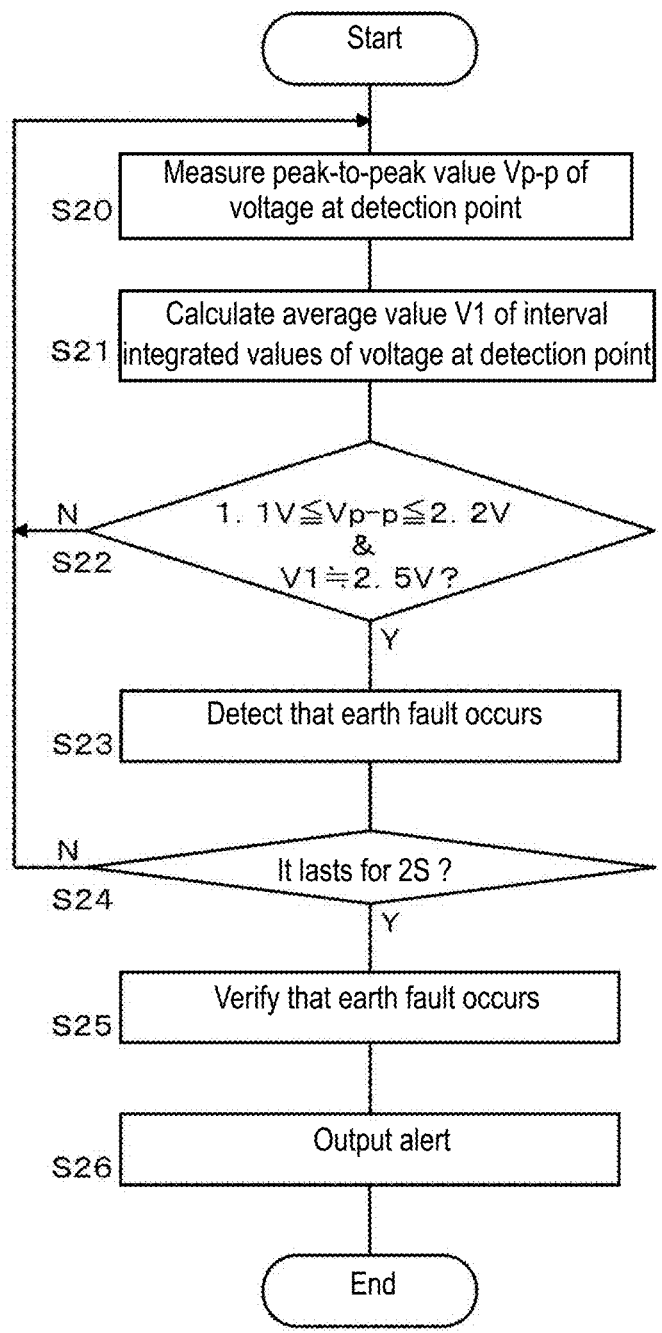
FIG. 3 is a flowchart of an earth fault determination method according to Example of the exemplary embodiment of the present invention.

FIG. 3 is a flowchart of an earth fault determination method according to Example. Earth fault determiner 13 measures peak-to-peak value Vp-p of the voltage at the detection point (S20). Earth fault determiner 13 calculates average value V1 of interval integrated values of the voltage at the detection point (S21). Earth fault determiner 13 determines whether measured peak-to-peak value Vp-p is more than or equal to the second reference value (1.1 V) and less than or equal to the first reference value (2.2 V) and whether calculated average value V1 is nearly equal to the center value (2.5 V) of the input voltage range (S22). When all of these conditions are satisfied (Y at S22), earth fault determiner 13 detects that an earth fault occurs (S23). When this state lasts for a preset time (two seconds in Example) (Y at S24), earth fault determiner 13 definitively verifies that the earth fault occurs (S25). After definitively verifying the occurrence of the earth fault, earth fault determiner 13 outputs an alert to the ECU (S26).

Figure 4:
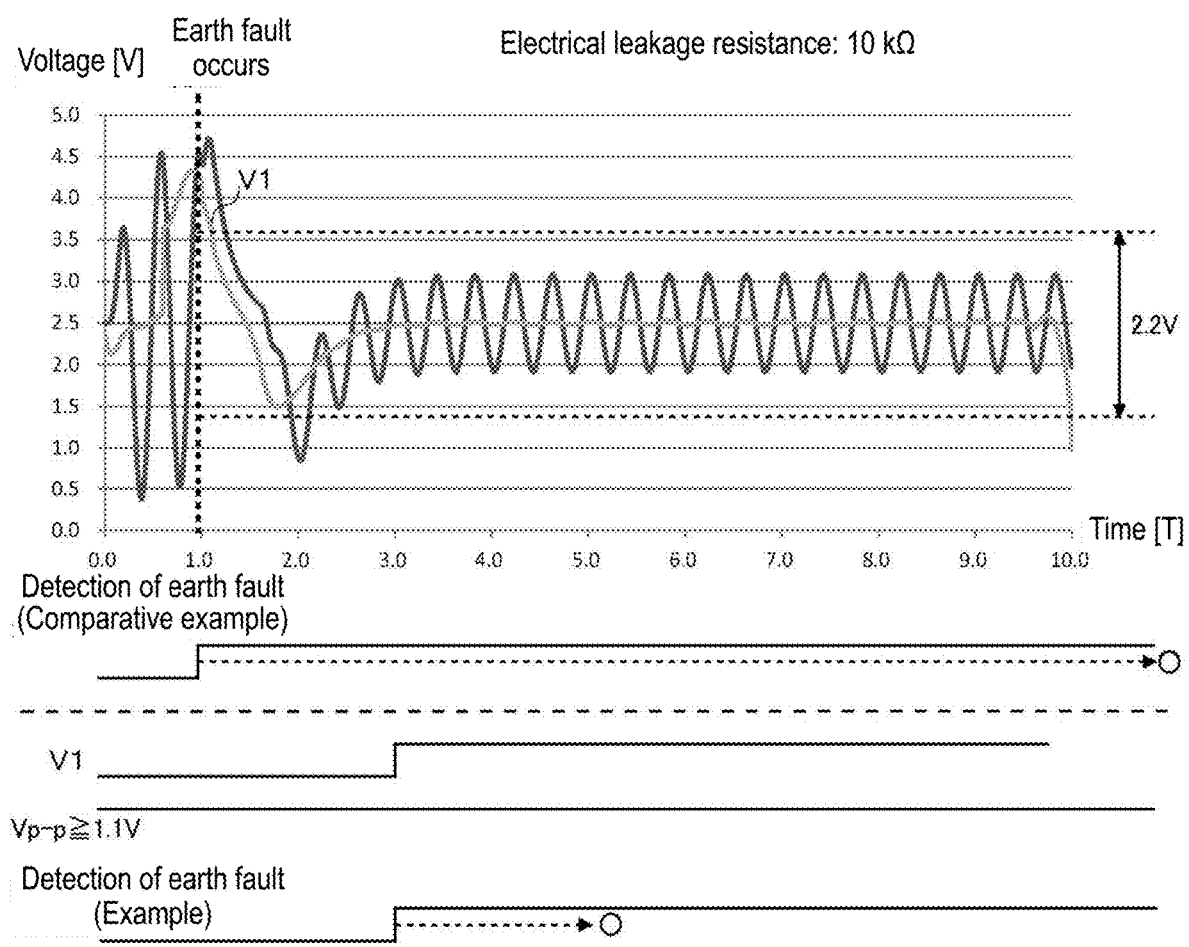
FIG. 4 illustrates a simulation result when an electrical leakage resistance is 10 kΩ.

FIG. 4 illustrates a simulation result when electrical leakage resistance R2 is 10 kΩ. In the example illustrated in FIG. 4, average value V1 is the average value of integrated values, over an interval of 400 ms, of the voltage at the detection point. In the comparative example, earth fault determiner 13 detects an earth fault and, after 10 seconds have passed, definitively verifies this earth fault. In the comparative example, the determination conditions for detecting an earth fault include the event in which peak-to-peak value Vp-p of the voltage at the detection point exceeds 4 V. In contrast, in Example, earth fault determiner 13 detects an earth fault when average value V1 that has been shifted from 2.5 V in response to an occurrence of an earth fault returns to 2.5 V. Then, after two seconds have passed, earth fault determiner 13 definitively verifies the earth fault. Since peak-to-peak value Vp-p of the voltage at the detection point is more than or equal to 1.1 V and less than or equal to 2.2 V at the time when average value V1 returns to 2.5 V, earth fault determiner 13 detects the earth fault at this time. It can be found that Example enables definitive verification of an occurrence of an earth fault in a short time, compared to the comparative example.

Figure 5:
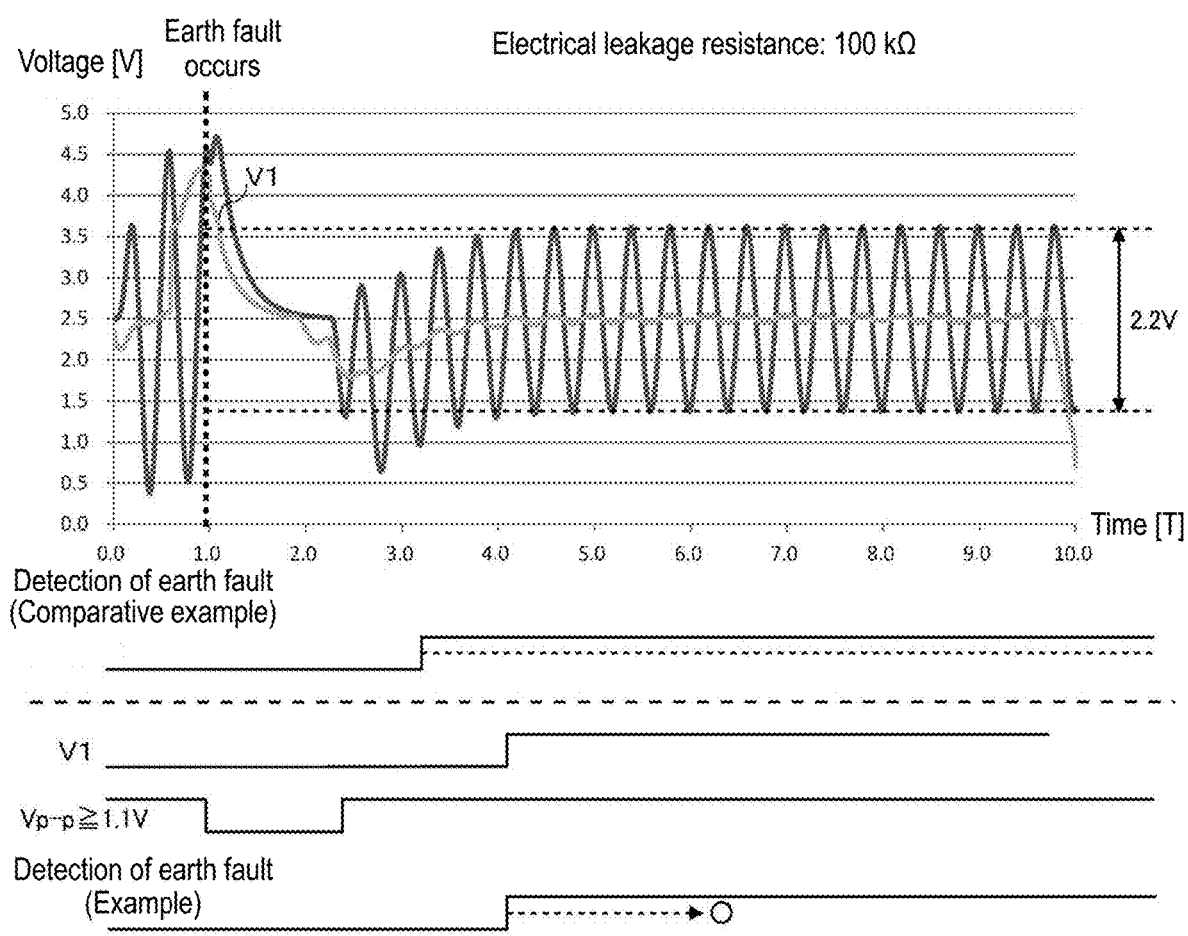
FIG. 5 illustrates a simulation result when the electrical leakage resistance is 100 kΩ.

FIG. 5 illustrates a simulation result when electrical leakage resistance R2 is 100 kΩ. In the comparative example, after an earth fault occurs, earth fault determiner 13 detects this earth fault at the time when peak-to-peak value Vp-p of the voltage at the detection point becomes less than or equal to 2.2 V. Then, after 10 seconds have passed, earth fault determiner 13 definitively verifies the earth fault. In contrast, in Example, earth fault determiner 13 detects an earth fault when average value V1 that has been shifted from 2.5 V in response to an occurrence of an earth fault returns to 2.5 V. Then, after two seconds have passed, earth fault determiner 13 definitively verifies the earth fault. Since peak-to-peak value Vp-p of the voltage at the detection point is more than or equal to 1.1 V and less than or equal to 2.2 V at the time when average value V1 returns to 2.5 V, earth fault determiner 13 detects the earth fault at this time. In this case, peak-to-peak value Vp-p of the voltage at the detection point becomes less than 1.1 V once, but returns to be more than or equal to 1.1 V at the time when average value V1 returns to about 2.5 V. It can be found that Example enables definitive verification of an occurrence of an earth fault in a short time, compared to the comparative example.

Figure 6:
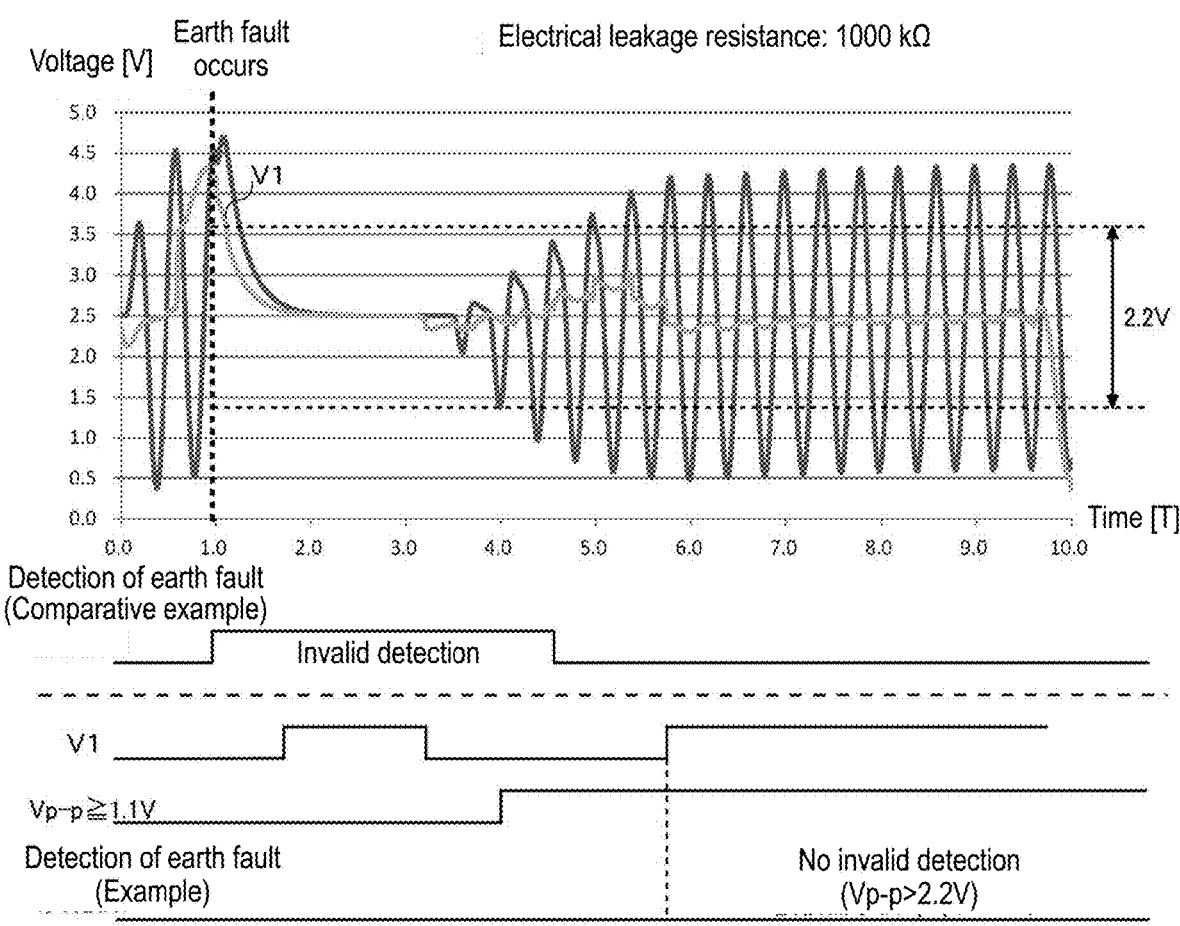
FIG. 6 illustrates a simulation result when the electrical leakage resistance is 1000 kΩ.

FIG. 6 illustrates a simulation result when electrical leakage resistance R2 is 1000 kΩ. In the comparative example, earth fault determiner 13 detects the earth fault at the time when an earth fault occurs. However, peak-to-peak value Vp-p of the voltage at the detection point exceeds 2.2 V before 10 seconds pass. Thus, earth fault determiner 13 makes the detection of the earth fault invalid. In contrast, in Example, a period over which three conditions in which average value V1 is about 2.5 V, peak-to-peak value Vp-p of the voltage at the detection point is more than or equal to 1.1 V, and peak-to-peak value Vp-p of the voltage at the detection point is less than or equal to 2.2 V are all satisfied is not generated. Therefore, earth fault determiner 13 does not detect an earth fault. As opposed to Example, the comparative example involves a process of detecting an electric leakage, as an earth fault, that should not be detected essentially.

Figure 7:
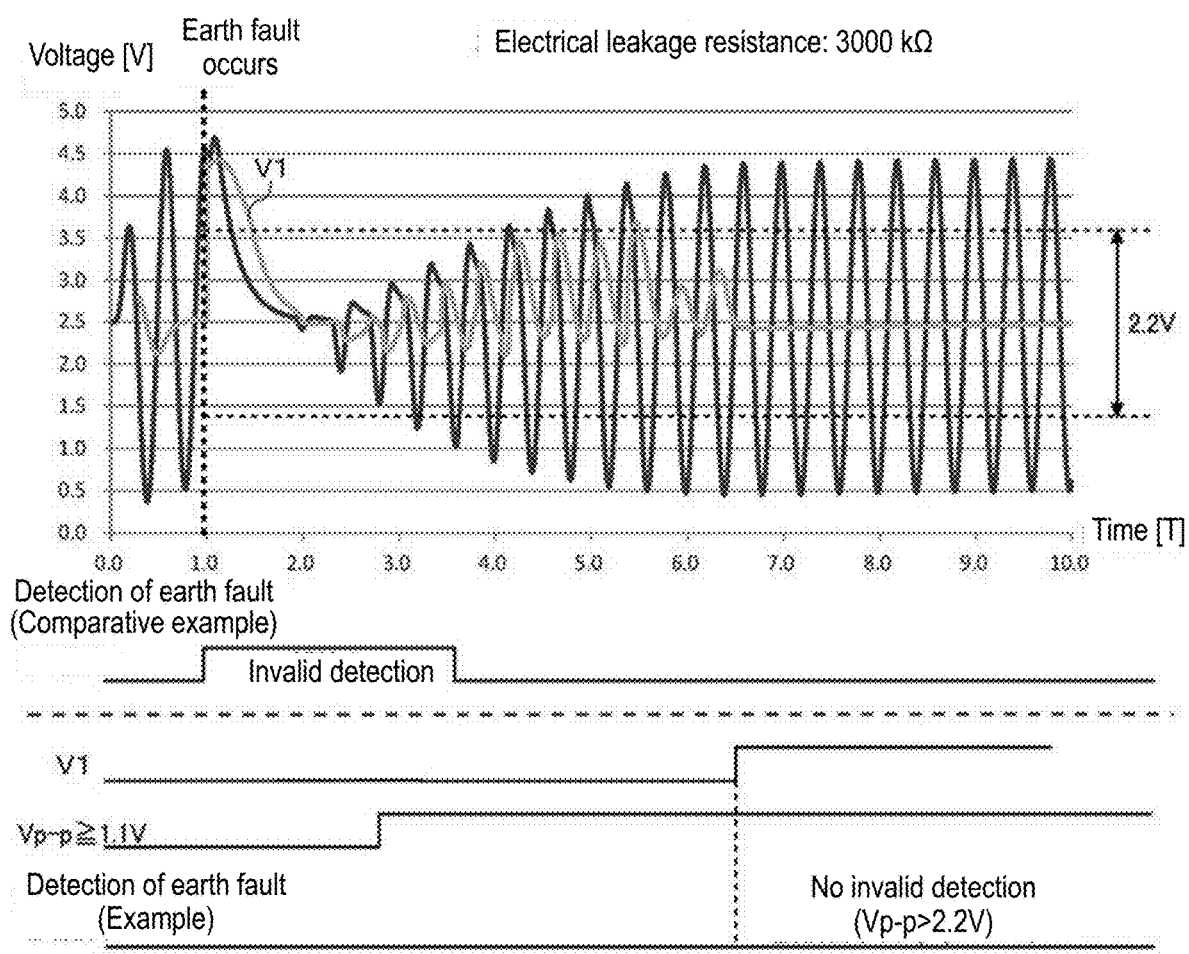
FIG. 7 illustrates a simulation result when the electrical leakage resistance is 3000 kΩ.

FIG. 7 illustrates a simulation result when electrical leakage resistance R2 is 3000 kΩ. In the example illustrated in FIG. 7, average value V1 is the moving average value of the voltages at the detection point over 42 sampling intervals. In the comparative example, earth fault determiner 13 detects the earth fault at the time when an earth fault occurs. However, peak-to-peak value Vp-p of the voltage at the detection point exceeds 2.2 V before 10 seconds pass. Thus, earth fault determiner 13 makes the detection of the earth fault invalid. In contrast, in Example, a period over which three conditions in which moving average value V1 is about 2.5 V, peak-to-peak value Vp-p of the voltage at the detection point is more than or equal to 1.1 V, and peak-to-peak value Vp-p of the voltage at the detection point is less than or equal to 2.2 V are all satisfied is not generated. Therefore, earth fault determiner 13 does not detect an earth fault. As opposed to Example, the comparative example involves a process of detecting an electric leakage, as an earth fault, that should not be detected essentially.

According to Example, as described above, the second reference value (1.1 V), which is set based on the peak-to-peak value of the voltage at the detection point when an earth fault completely occurs, is used to specify an input range of the voltage at the detection point. This can precisely determine effectiveness of an input value for earth fault determiner 13. Furthermore, by further using a process of determining whether the average value of interval integrated values of the voltage at the detection point is at or near the center value of the input voltage range, it is possible to further precisely determine the effectiveness of the input value for earth fault determiner 13. This can prevent earth fault determiner 13 from determining an occurrence of an earth fault based on an input value whose effectiveness has not yet been verified.

In the comparative example, a long time is reserved to definitively verify the detection of an earth fault, in order to verify the effectiveness of the input value for earth fault determiner 13. According to Example, however, the comparison using the second reference value and the comparison using the average value of the interval integrated values are made to be able to greatly shorten the time for definitively verify the detection of an earth fault.

To shorten a time required to definitively verify the detection of an earth fault while ensuring an earth fault determination precision, a high-pass filter or a protective circuit can be connected between detection point N1 and filter 30. However, an increasing number of components might lead to a lowered reliability and a cost increase. According to Example, a mechanism for preventing an erroneous determination can be implemented in software for a microcomputer. This can shorten a time required to definitively verify the detection of an earth fault, without having to use additional hardware.

The present invention has been described based on the exemplary embodiment. It is to be understood to a person with ordinary skill in the art that the exemplary embodiment is an example, and various modifications of each of component elements and combinations of each treatment process may be made and the modifications are included within the scope of the present invention.

In Example described above, peak-to-peak value Vpp of the voltage at the detection point is compared with each of the first and second reference values. In this case, peak-to-peak value Vpp of the voltage at the detection point is compared with each of the first and second reference values (peak-to-peak values). In this case, an amplitude value of the voltage at the detection point may be compared with each of the first and second reference values (amplitude values). The comparison using the amplitude values can achieve the determination with the same precision, especially when the center value of the voltage at the detection point is positioned at or near 2.5 V.

The exemplary embodiment may be specified by items described below.

[Item 1]

Earth fault detecting device (2) includes: impedance element (R1) to which a predetermined alternating-current (AC) voltage is applied;

capacitor (C1) connected between an output terminal of impedance element (R1) and electricity storage unit (3) mounted in a vehicle, electricity storage unit (3) being electrically insulated from a chassis of the vehicle; and earth fault determiner (13) that determines whether an earth fault is present in electricity storage unit (3), based on a detection value, the detection value being based on a peak-to-peak value of a voltage at a node between impedance element (R1) and capacitor (C1), earth fault determiner (13) determining that the earth fault occurs, when the detection value is less than or equal to a first reference value and more than or equal to a second reference value, the first reference value being set based on the peak-to-peak value of the voltage at the node when insulation resistance (R2) between electricity storage unit (3) and the chassis of the vehicle is a minimum allowable value, the second reference value being set based on the peak-to-peak value of the voltage at the node when a complete earth fault occurs between electricity storage unit (3) and the chassis of the vehicle.

This configuration can precisely and briefly determine presence/absence of an earth fault.

[Item 2]

Earth fault detecting device (2) according to Item 1 further includes: filter (30) that removes a high-frequency component from the voltage at the node to adjust an offset of the voltage; and analog-to-digital (AD) converter (12) that converts an analog voltage received from filter (30) into a digital value and outputs the digital value to earth fault determiner (13), in which earth fault determiner (13)

calculates an average value of interval integrated values, over a unit period, of an AC voltage at the node, an average value of a maximum value and a minimum value of the AC voltage over the unit period, or a moving average value of the AC voltage over a predetermined period, and determines that the earth fault occurs, when the detection value is less than or equal to the first reference value and more than or equal to the second reference value and the average value is substantially equal to a center value of an input voltage range of AD converter (12).

This configuration can further precisely and briefly determine presence/absence of an earth fault.

[Item 3]

Earth fault detecting device (2) according to Item 2, in which earth fault determiner (13) determines that the earth fault occurs, when a state where the detection value is less than or equal to the first reference value and more than or equal to the second reference value and the average value is substantially equal to the center value of the input voltage range of AD converter (12) lasts for a preset time.

This configuration can further precisely and briefly determine presence/absence of an earth fault.

[Item 4]

Electricity storage system (1) includes: electricity storage unit (3) mounted in a vehicle, the electricity storage unit (3) being used for the vehicle to run; and earth fault detecting device (2) according to any one of Items 1 to 3 that detects an earth fault between electricity storage unit (3) and a chassis of the vehicle.

This configuration achieves electricity storage system (1) that can precisely and briefly determine presence/absence of an earth fault.

The invention claimed is:

1. An earth fault detecting device comprising:
an impedance element to which a predetermined alternating-current (AC) voltage is applied;
a capacitor connected between an output terminal of the impedance element and an electricity storage unit mounted in a vehicle, the electricity storage unit being electrically insulated from a chassis of the vehicle;
an earth fault determiner that determines whether an earth fault is present in the electricity storage unit, based on a detection value, the detection value being based on a peak-to-peak value of a voltage at a node between the impedance element and the capacitor;
a filter that removes a high-frequency component from the voltage at the node to adjust an offset of the voltage; and
an analog-to-digital (AD) converter that converts an analog voltage received from the filter into a digital value and outputs the digital value to the earth fault determiner, wherein the earth fault determiner
determines that the earth fault occurs, when the detection value is less than or equal to a first reference value and more than or equal to a second reference value, the first reference value being set based on the peak-to-peak value of the voltage at the node when an insulation resistance between the electricity storage unit and the chassis of the vehicle is a minimum allowable value, and the second reference value being set based on the peak-to-peak value of the voltage at the node when a complete earth fault occurs between the electricity storage unit and the chassis of the vehicle,
calculates an average value of interval integrated values, over a unit period, of an AC voltage at the node, an average value of a maximum value and a minimum value of the AC voltage over the unit period, or a moving average value of the AC voltage over a predetermined period, and
determines that the earth fault occurs, when the detection value is less than or equal to the first reference value and more than or equal to the second reference value and the average value is substantially equal to a center value of an input voltage range of the AD converter.

2. The earth fault detecting device according to claim 1, wherein the earth fault determiner determines that the earth fault occurs, when a state where the detection value is less than or equal to the first reference value and more than or equal to the second reference value and the average value is substantially equal to the center value of the input voltage range of the AD converter lasts for a preset time.

3. An electricity storage system comprising:
an electricity storage unit mounted in a vehicle, the electricity storage unit being used for the vehicle to run; and
the earth fault detecting device according to claim 2 that detects an earth fault between the electricity storage unit and a chassis of the vehicle.

4. An electricity storage system comprising:
an electricity storage unit mounted in a vehicle, the electricity storage unit being used for the vehicle to run; and
the earth fault detecting device according to claim 1 that detects an earth fault between the electricity storage unit and a chassis of the vehicle.

* * * * *